United States Patent [19]

Warder

[11] Patent Number: 4,644,260

[45] Date of Patent: Feb. 17, 1987

[54] COUPLER WITH COUPLED LINE USED TO CANCEL FINITE DIRECTIVITY

[75] Inventor: Philip C. Warder, Ft. Worth, Tex.

[73] Assignee: Motorola, Inc., Schaumburg, Ill.

[21] Appl. No.: 762,185

[22] Filed: Aug. 5, 1985

[51] Int. Cl.[4] ........................ H03H 7/38; G01R 27/04

[52] U.S. Cl. ........................................ 324/58 B; 333/35

[58] Field of Search .................... 343/17.1; 333/32-35; 455/115; 324/58 R, 58 A, 58 B

[56] References Cited

U.S. PATENT DOCUMENTS

| | | | |
|---|---|---|---|
| 3,694,747 | 9/1972 | White | 324/95 |
| 3,949,169 | 4/1976 | Braeckelmann | 375/36 |
| 3,965,445 | 6/1976 | Ou | 333/33 |
| 4,013,981 | 3/1977 | Shintani et al. | 333/28 R |
| 4,034,289 | 7/1977 | Rozylowicz et al. | 324/95 |
| 4,075,581 | 2/1978 | Davidson et al. | 333/116 |
| 4,211,911 | 7/1980 | Dehn | 219/10.55 F |
| 4,249,258 | 2/1981 | Craven | 455/115 |
| 4,485,360 | 11/1984 | Seward | 333/17 M |

FOREIGN PATENT DOCUMENTS

| | | | |
|---|---|---|---|
| 0647619 | 2/1979 | U.S.S.R. | 324/58 B |
| 0777597 | 11/1980 | U.S.S.R. | 324/58 B |

OTHER PUBLICATIONS

IEEE MTTS International Microwave Symposium Digest, 1975, Buntschuh, pp. 125-127.

*Primary Examiner*—Reinhard J. Eisenzopf
*Assistant Examiner*—Jose M. Solis
*Attorney, Agent, or Firm*—Steven G. Parmelee

[57] ABSTRACT

A directional coupler is disclosed comprising either a stripline or microstrip transmission line coupler apparatus serially coupled to an error correcting circuitry which is designed to minimize the standing wave in the coupled line. Elimination of the standing wave in coupled line results in a directional coupler of better accuracy. The error correcting circuitry uses an impedance mismatch of a preselected magnitude and phase angle which are determined by varying the same at a particular frequency until the standing wave of the coupled line is minimized. In the preferred embodiment, a length of coaxial cable is used.

4 Claims, 5 Drawing Figures

—PRIOR ART—

—PRIOR ART—

—PRIOR ART—

COUPLER WITH COUPLED LINE USED TO CANCEL FINITE DIRECTIVITY

TECHNICAL FIELD

This invention relates to a directional coupler apparatus with improved accuracy wherein an error correcting impedance or circuitry is connected to a directional coupler to improve the accuracy of the coupler.

BACKGROUND OF THE INVENTION

Directional couplers are used to measure the forward and reflected voltage or power of a transmission line and are well known in the art. These couplers can be used in metering circuits for transmission lines where the forward or reflected voltage or power ratio is desired.

In an ideal situation, directivity is infinite such that only the forward travelling wave is coupled to the forward port and only the reverse travelling wave is connected to the reverse port. Ideal situations are characterized by a perfectly uniform dielectric surrounding the transmission lines.

Typically, directional couplers are of the microstrip or strip line type. These couplers are comprised of conducting strips and a ground plane separated by a dielectric. Due to the nonhomogeneity of the dielectric used in the couplers, the directivity thereof is finite.

Energy propogates through a media (air or dielectric) at a velocity governed by the dielectric constant of the material. The propogation velocity can be formulated as follows:

$$V = \frac{c}{\sqrt{E_r}}$$

where,

V=velocity of propogation c=speed of light in a vacuum

Er=dielectric constant relative to air.

Thus a non-momogenous dielectric causes variations in Er which result in variations in the propogation velocity and a finite directivity.

Those in the art have tried to compensate for the finite directivity of the coupler by adding a dielectric cap to a conventional microstrip coupler.

FIG. 1 illustrates a conventional microstrip type coupler. Identification numbers 2 and 3 represent the main and coupled lines. These lines 2 and 3 are copper plated and are disposed on a substrate material 4 of a dielectric material 4 which is mounted on a copper plated ground plane 5. FIG. 2 illustrates a compensated microstrip A type coupler which is essentially the same as that illustrated in FIG. 1, except that a dielectric cap 6 is added to the top of the conductors 2, 3. The dielectric cap 6 was added to compensate for the nonhomogeneity of the dielectric. This technique is described in an article titled, "High Directivity Microstrip Couplers Using Dielectric Overlap" published in IEEE MTTS International Microwave Symposium Digest, 1975, pages 125 to 127.

The technique of using a dielectric cap inherently creates an air gap between the two dielectric substrates which is amenable to warpage and can cause an uneven air gap. The uneven air gap results in a difference in phase velocities, albeit a smaller difference than that of a conventional noncompensated microstrip coupler, nevertheless sufficient to affect the directivity and hence the accuracy of the coupler. Thus, the compensation of the coupler by adding a dielectric cap thereto creates another problem of the uneven air gap between substrates.

Compensation of a stripline type coupler is very similar to the microstrip type. A dielectric cap or overlay is disposed on top of the coupler conductors. One difference with the microstrip is that the cap of the stripline coupler also carries a ground plane. Similar to the compensated microstrip coupler, the stripline coupler is also subject to the problems of the microstrip coupler of uneven air gaps.

Thus, there exists a need to provide a directional coupler which compensates for the finite directivity caused by the non-homgeneity of the dielectric without causing other problems inherent in the dielectric cap couplers. Such a coupler with improved accuracy would be widely received by the industry.

SUMMARY OF THE INVENTION

In accordance with the present invention, a directional coupler with an improved efficiency is disclosed for insertion in a transmission line wherein it is desirable to measure the forward or reflected voltage wave or a ratio thereof.

The improved directional coupler can be either a stripline or microstrip type coupler or dielectric overlap structure coupled to an error correcting impedance or circuitry.

Conventional directional couplers are subject to a finite directivity because of the nonhomogeneity of the dielectric material used in the couplers, even though the coupler is terminated in its characteristic impedance. This results in a certain finite directivity of the coupler which can be cancelled out by adding an impedance of a given magnitude and phase angle that essentially cancels the directivity.

In the present invention, a length of coaxial cable is connected to the coupled line of the directional coupler. The length of the coaxial line and its corresponding termination determines the impedance thereof. The length is varied to reduce the standing waves in the coupled line and thus improve the accuracy. Specifically, at a desired frequency, the length of coaxial cable is varied while the standing wave ratio of the coupled line is being accurately measured. The length of coaxial cable that produces the smallest standing wave in coupled line is selected. In alternate embodiments, impedance circuits, other than the coaxial cable, can be used. The criterion for determining the magnitude and phase angle of the impedance circuit would be the same as that for the coaxial cable.

Numerous other advantages and features of the present invention will become readily apparent from the following description of the invention and its various embodiments and from the claims and from the accompanying drawings.

DETAILED DESCRIPTION

Figure 1:
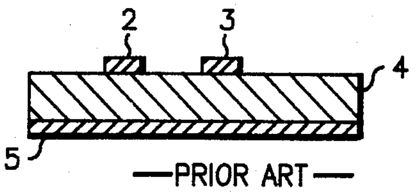
FIG. 1 is a side view of a conventional microstrip transmission line coupler.
Figure 2:
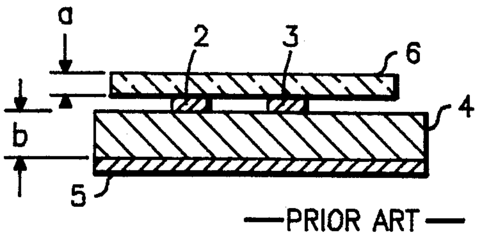
FIG. 2 is a side view of the coupler in Figure with the addition of a dielectric cap disposed over the conductors.

While this invention is susceptible of embodiment in many different forms, there is shown in the drawings, which will be herein described in detail, a preferred embodiment of the invention. It should be understood; however, that the present disclosure is to be considered as an exemplification of the principles of the invention and is not intended to limit the invention to any specific embodiment illustrated.

Figure 3:
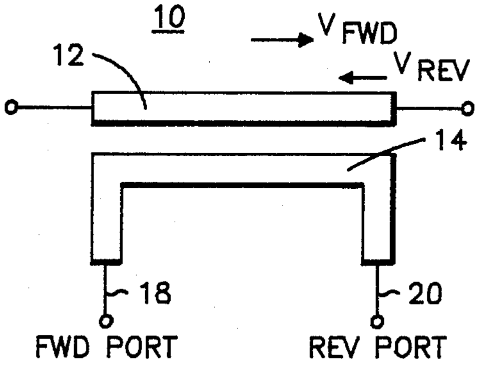
FIG. 3 is a schematic representation of a conventional directional coupler.

Referring to the drawings, FIG. 3 is a schematic representation of a conventional directional coupler 10. The coupler 10 is comprised of a main line 12 which is inserted in series with a transmission line (not shown). The coupled line 14 is conventionally terminated in impedances (not shown) at both the forward port 18 and the reverse port 20 which are equivalent to the characteristic impedance $Z_o$ of the coupled line 14. As is known by those skilled in the art, a forward wave travelling on the mainline 12 will induce a forward travelling wave on the coupled line 14 which can be sensed across a sensing impedance (not shown) connected to the forward port 18. Similarly a reverse wave on the mainline 12 will endure a reverse travelling wave on the coupled line 14 which can be sensed across a sensing impedance connected to the reverse port 20.

The object of the directional coupler is to measure the forward and reverse travelling waves on the mainline 12 as accurately as possible. However, if the coupled line 14 contains its own standing waves, the accuracy of the coupler in measuring the standing waves of the main line will be greatly impaired. Thus it is necessary to greatly reduce or eliminate the standing waves of the coupled line. This is done conventionally be terminating both the forward port 18 and the reverse port 20 in impedances which are equivalent to the characteristic impedance of the coupled.

Figure 4:
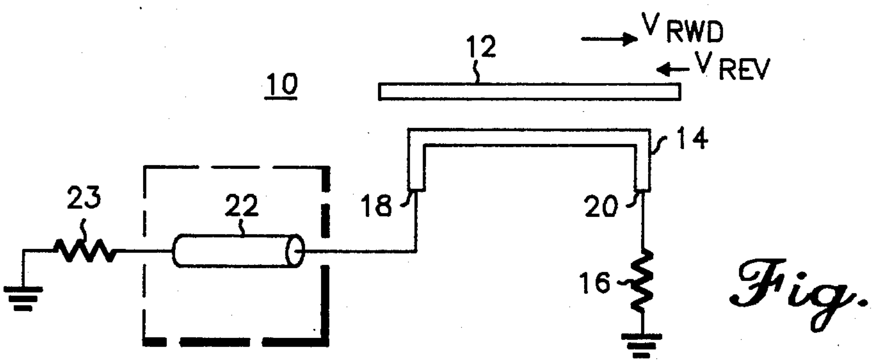
FIG. 4 is a schematic representation of a directional coupler in accordance with the present invention.

FIG. 4 illustrates a schematic representation of a directional coupler 10 with improved accuracy in accordance with the present invention. The directional coupler 10 is comprised of a main line 12 a coupled line 14, sensing impedances 16 and 18 and an error correcting impedance 20.

The coupled line 14 has two ports; a forward port 18 and a reverse port 20. The reverse port 20 is coupled to sensing impedance 16. The forward port 18 is connected to an error correcting impedance 22. The error correcting impedance circuit 22 is connected to a sensing impedance 23.

The error or tolerance factor can be identified by formulating the voltage at either the forward or reverse port of the directional coupler. The voltage at the forward port is:

$$V_1=KV_F+KDV_R+R_R(KV_R+KDV_F) \quad (A)$$

K=coupler constant
D=directivity vector
$V_F$=forward mainline voltage
$V_R$=reverse mainline voltage
$R_R$=coefficient which also accounts for the phase shift of the waveform as it comes back around to the forward port Similarly the incident voltage at the reverse port 20 of the coupled line 14 can be formulated as follows:

$$V_2=KV_R+KDV_FR_F(KV_F+KDV_R)), \quad (B)$$

wherein $R_F$ is analogous to $R_R$.

The object of the directional coupler is to sense the mainline forward and reflected voltages. Therefore, it is necessary to relate the incident voltages at the forward and reverse ports of the coupled line 14 to mainline forward and reverse voltages.

The mainline voltages can be assumed to be related by the following relationship:

$$V_R=aV_F \quad (C)$$

Where a is reflection coefficient of the mainline 12.

Substituting equation (C) into equations (A) and (B) yields an equation for the incident voltage at the forward port as follows:

$$V_1=KV_F[1+Da=R_R(a+D)] \quad (D)$$

Similarly, the voltage at the reverse port can be formulated as in equation E:

$$V_2=KV_F[a+D+R_F(1+aD)] \quad (E)$$

The first term in each of equations (D) and (E) is the only term that is desirable since this is the only term that relates mainline voltage to the coupled line voltage proportional. The other terms in equations relate to the error or tolerance in the measurement. Therefore if the reflection $R_R$ or $R_F$ could be made to be equivalent to the negative of the directivity D, the error or tolerance would be reduced substantially. Therefore, substituting this relationship into equation (D) the incident voltage $V_1$ at the forward port becomes;

$$V_1=KV_F[1-(D)^2]$$

Since the directivity D is a term which is less than one, the square of the directivity term results in a very small number. Therefore, the incident voltage $V_1$ at the forward port is essentially equal to the forward mainline voltage $V_F$ times the coupler constant K.

In this manner, the voltage sensed at the sensing impedance 16 or 18 are a much more accurate representation of the mainline voltage. Also the sensed voltage is also mismatch independent since the tolerance terms relating to the reflection and finite directivity are essentially cancelled.

Referring back to FIG. 4, the error correcting impedance 22 is carefully selected such that the reflection terms and directivity terms in equations D and E cancel. This is done experimentally.

Conventionally, sensing impedance 23 would be selected to match the impedance of the coupled line 14. Although the coupled line would be matched, there would still be standing waves because of the nonhomogeneity of the dielectric in the coupler. To cancel this finite directivity, a length of coaxial cable is inserted between the forward port 18 and sensing impedance 23. Contrary to convention the coaxial cable is not selected to match the impedance of the sensing impedance 23. Rather it is selected to cancel the finite directivity of the coupler. This lenth coaxial cable is determined experimentally by trail and error.

As known to those skilled in the skilled in the art, the impedance from port 18 to ground can be set to any arbitrary value by varying the length and characteristic $Z_o$ of line 22. Variations in the impedance at port 18 will cause a corresponding variation in the value of the previously described coefficient $R_F$. As indicated, it is desired to cause $R_F$ and the directivity to cancel. It should be apparent from that control of the length and characteristic impedance of the line 22 will therefore allow $R_F$ to be forced to the value necessary to achieve cancellation.

In order to ascertain the particular length of the coaxial cable required, the cable length is varied while the standing wave ratio of the coupled line is measured at the desired frequency. That length of cable which indicates that the chosen voltage ratio is at a minimum is selected.

Figure 5:
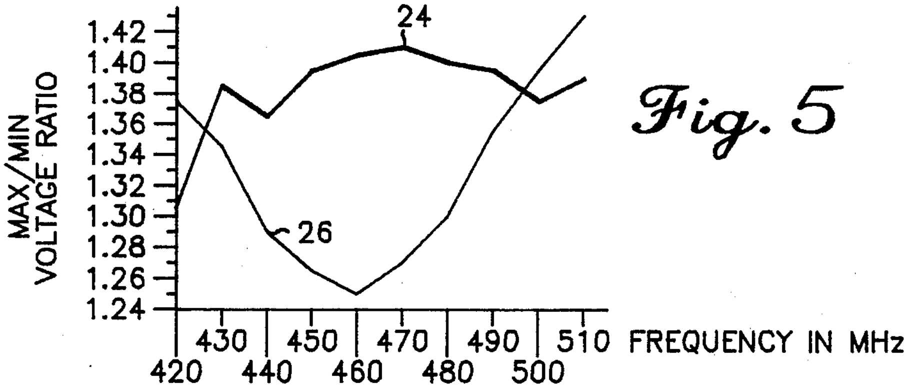
FIG. 5 is a graph of frequency versus voltage ratio for both a conventional coupler and a coupler in accordance with the present invention.

FIG. 5 represents a curve of frequency versus voltage ratio. The upper curve 24 represents the voltage ratio of a conventional directional coupler at frequencies of 420 MHz to 510 MHz versus frequency.

Curve 26 indicates the results of varying the length of a 50 ohm coaxial cable, which was inserted between the coupled line and forward port termination to adjust the phase of reflection. The length of the coaxial cable was chosen to minimize the standing voltage ratio at 460 MHz.

These surprising results can be appreciated by comparing the voltage ratios at a particular frequency. For example, a comparison of the voltage ratio in FIG. 5 at 460 MHz shows that curve 26 has a ratio of about 1.25, whereas curve 24 at the same frequency shows a ratio of above 1.4. The 1.4 voltage ratio results in a 2 to 1 ratio in reflected power. The 1.25 to 1 voltage ratio corresponds to 1.55 to 1 ratio in reflected power. Thus it can be seen that a coupler in accordance with the present invention. has greatly improved accuracy.

It should be noted that the instant invention contemplates that the standing wave ratio of the coupled line be identical to that of the mainline. Thus, the mainline is terminated to simulate a 0 zero reflection coefficient resulting in no standing waves on the mainline while the length of the coaxial cable is varied to determine the optimum length by terminating the mainline to eliminate standing waves. However due to facility of instrumentation, the results illustrated in FIG. 5 were generated with a mainline terminated so as to produce a unity reflection coefficient. Ideally the ratio of maximum to minimum voltage ratio of the coupled line would be 1. Curve 26 illustrates a ratio of about 1.25. The inability to attain ideal conditions is a result of practical limitations. One such limitation is the ability to terminate the mainline so as to produce a reflection coefficient of exactly unity. Another such limitation relates to the magnitude or absolute value of the error correcting impedance 22. The invention contemplates cancelling the directivity term by adding an impedance which is equal in magnitude but 180 degrees out of phase. The results illustrated on FIG. 5 reflect using a length of 50 ohm coaxial cable and varying its length to achieve optimum results. Due to the characteristics of such a cable, varying the length of the cable predominantly varied the phase angle. Thus, the magnitude of the error impedance 22 will not be equal to the directivity term, when this impedance is about 180 degrees out ot phase with it. However if a separate impedance matching circuit were used, both the magnitude and the phase angle could be adjusted to completely cancel the directivity term.

It should be kept in mind that the impedance that is added to the circuit to cancel the finite directivity of the directional coupler is frequency dependent. Thus, the surprising results of the herein disclosed invention could be realized only over a relatively narrow bandwidth.

It should be also apparent that instead of using a coaxial cable to cancel the error or tolerance impedance that a variety of matching networks could also be used, wherein the magnitude and phase angle is selected to minimize the standing wave ratio.

In operation, the improved directional coupler is inserted into a transmission line to be monitored. Signals representing the transmission line forward and reflected voltages are available at impedances 16 and 23. These signals can be directed to a remote meter (not shown) and used to measure the standing wave ratio. These signals can also be used as control signals. For instance, certain radios require reverse power limiting. In these radios, reflected power is alternated above a certain threshold.

Thus it should be apparent that a unique directional coupler is disclosed and a method for making the same. The directional coupler and the method for making it are readily adaptable to conventional design practices. Moreover, while this invention is described in conjunction with specific embodiments, it should be apparent that there are alternatives, modifications and variations which will be apparent to those skilled in the art of the foregoing description. According, it is intended to cover all such alternatives, modifications and variations that fall within the spirit and broad scope of the appended claims.

I claim:

1. A method for reducing an undesired signal's magnitude at a coupled port of a directional coupler, said undesired signal resulting from finite directivity associated with said directional coupler, said method comprising the steps of:

providing a directional coupler having a main line and a coupled line, wherein said coupled line has a first port and a second port;

operably connecting an error correcting impedance to said first port of said coupled line;

selectively varying said error correcting impedance to cause a mismatch between coupled line impedance and said error correcting impedance at said first port to thereby cause a reflection of voltage to appear at said second port that is substantially equal in magnitude and opposite in polarity to an undesired signal that appears at said second port due to finite directivity associated with said directional coupler, such that said reflection of voltage and said undesired signal substantially cancel one another at said second port.

2. The method of claim 1 wherein said error correcting impedance connects between said first port and a sensing impedance.

3. The method of claim 1 wherein said error correcting impedance includes a length of coax cable, the length of which will influence polarity of said reflection of voltage at said second port.

4. The method of claim 2 wherein said error correcting impedance includes an impedance that can be varied to thereby vary magnitude of said reflection of voltage at said second port.

* * * * *